United States Patent
Chiang et al.

(10) Patent No.: US 9,122,828 B2
(45) Date of Patent: Sep. 1, 2015

(54) APPARATUS AND METHOD FOR DESIGNING AN INTEGRATED CIRCUIT LAYOUT HAVING A PLURALITY OF CELL TECHNOLOGIES

(71) Applicant: Taiwan Semiconductor Manufacturing Co., Ltd., Hsin-Chu (TW)

(72) Inventors: Tsung-Yu Chiang, Taipei (TW); Kuang-Hsin Chen, Jung-li (TW); Song-Bor Lee, Zhubei (TW); Bor-Zen Tien, Hsinchu (TW); Tzong-Sheng Chang, Chubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/896,373

(22) Filed: May 17, 2013

(65) Prior Publication Data
US 2014/0344770 A1 Nov. 20, 2014

(51) Int. Cl.
*G06F 17/50* (2006.01)

(52) U.S. Cl.
CPC .................... *G06F 17/5072* (2013.01)

(58) Field of Classification Search
CPC ............ G06F 17/5068; G06F 17/5077; G06F 17/5072; G06F 17/5081; H01L 27/0207
See application file for complete search history.

(56) References Cited

U.S. PATENT DOCUMENTS

| | | | | |
|---|---|---|---|---|
| 5,812,412 | A * | 9/1998 | Moriizumi et al. | 716/55 |
| 6,750,122 | B1 * | 6/2004 | Schafbauer | 438/491 |
| 6,906,398 | B2 | 6/2005 | Yeo et al. | |
| 2003/0014723 | A1 * | 1/2003 | Braun | 716/10 |
| 2006/0206849 | A1 * | 9/2006 | Yamamoto | 716/11 |
| 2007/0136709 | A1 * | 6/2007 | Rodman | 716/8 |
| 2009/0019417 | A1 * | 1/2009 | Takeda | 716/18 |

* cited by examiner

*Primary Examiner* — Vuthe Siek
*Assistant Examiner* — Aric Lin
(74) *Attorney, Agent, or Firm* — Duane Morris LLP

(57) ABSTRACT

A system and method of designing a layout for a plurality of different logic operation (LOP) cell technologies includes defining a priority for each LOP cell technology in the plurality of different LOP technologies and forming a layout of the plurality of different LOP cells for formation on a substrate with at least some of the LOP cells of higher priority LOP technologies overlapping LOP cells of lower priority LOP technologies. The system can include a processor coupled to memory where stored code defines the priority for each different cell technology in the plurality of LOP cells and (when the code is executed) the processor forms the layout of a plurality of different LOP cells. All of the LOP cells of higher priority LOP technologies overlap LOP cells of lower priority. The system or method also avoids the overlap of higher priority LOP cells by lower priority LOP cells.

18 Claims, 4 Drawing Sheets

10

20

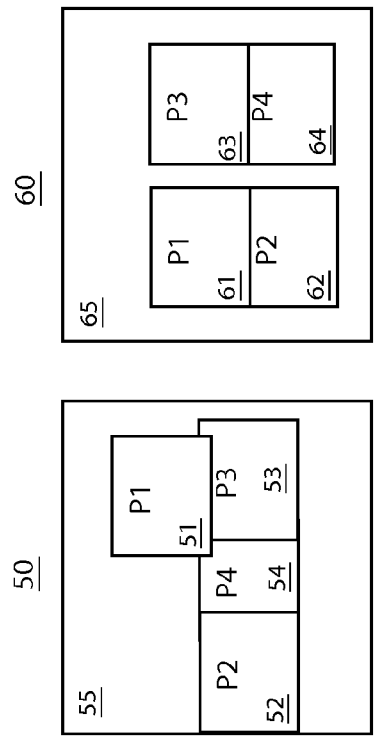
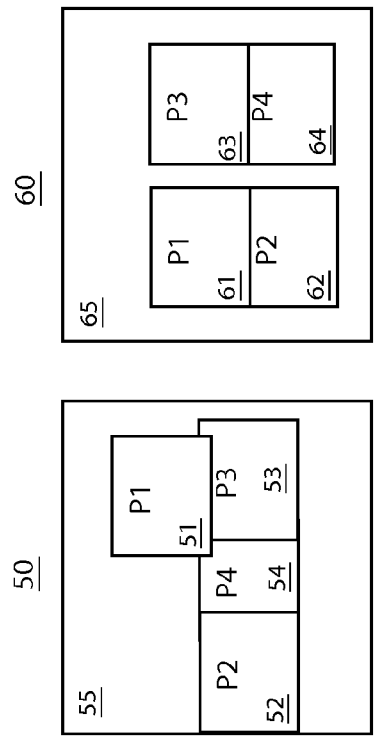
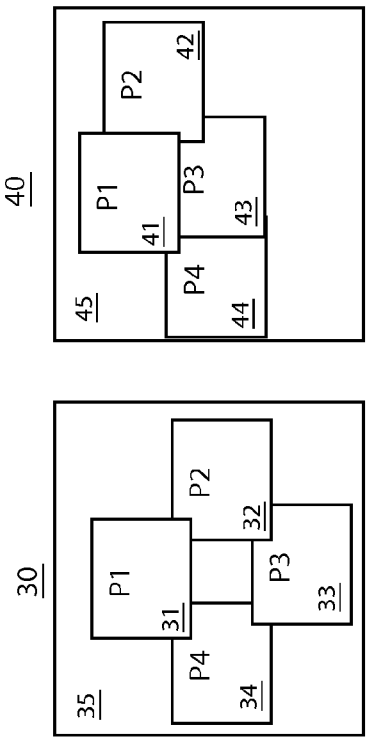
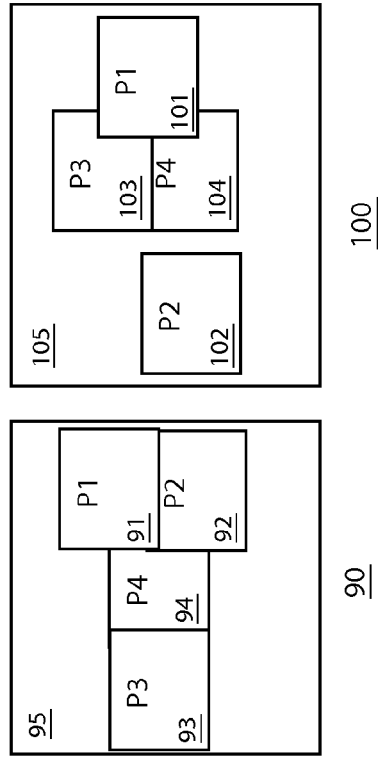
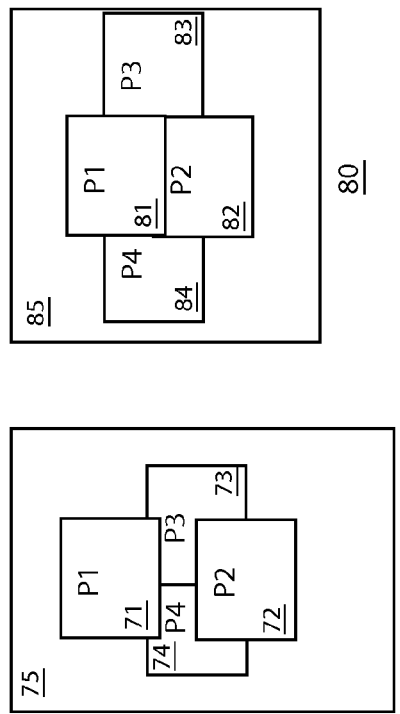

APPARATUS AND METHOD FOR DESIGNING AN INTEGRATED CIRCUIT LAYOUT HAVING A PLURALITY OF CELL TECHNOLOGIES

TECHNICAL FIELD

The disclosure is related to a method and apparatus for designing an integrated circuit layout having a plurality of cell technologies.

BACKGROUND

Mixed technologies on a single wafer can present challenges. Certain technologies have higher performance and corresponding higher leakage power while other technologies have lower performance and corresponding lower leakage power. When designing the layout of certain logic circuits, the conventional design strategy is to not allow an overlap of cell layouts for cells of different technologies or to allow some overlap at the risk of creating complexity and issues that affects the functionality of the overall integrated circuits used on a single wafer. Such design layout strategies ultimately fail to provide for a device having both high performance (such as high switching speed) and low leakage current.

The overlap designs having mixed technologies are haphazard and only tend to confuse the operational function of the devices in the design. As design sizes become smaller and smaller and the drive for higher density devices increases, the greater the potential problems in mixing and overlapping different cell technologies on a single wafer.

BRIEF DESCRIPTION OF THE DRAWINGS

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings.

FIG. 3 is a top plan view of a layout of a plurality of different LOP cells for formation on a substrate all of the LOP cells of higher priority LOP technologies overlapping LOP cells of lower priority LOP technologies in accordance with the embodiments;

FIGS. 4-10 illustrate other top plan views of an integrated circuit design of mixed cell technologies on a single wafer with at least some of the LOP cells of higher priority LOP technologies overlapping LOP cells of lower priority LOP technologies in accordance with the embodiments.

DETAILED DESCRIPTION

Figure 1:
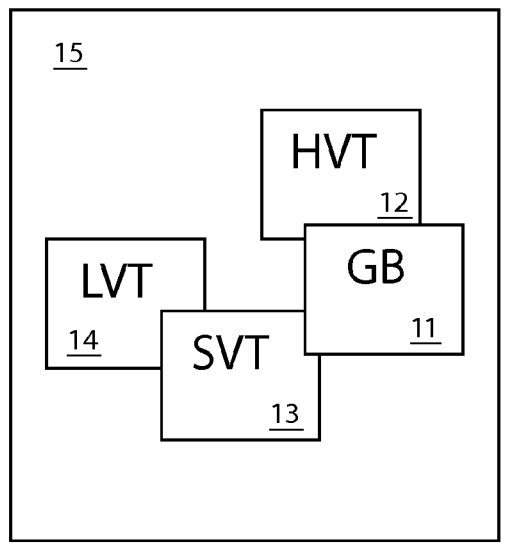
FIG. 1 is a diagram schematically representing a top plan view of an integrated circuit design of mixed cell technologies on a single wafer with at least some of the LOP cells of higher priority LOP technologies overlapping LOP cells of lower priority LOP technologies in accordance with the embodiments.
Figure 2:
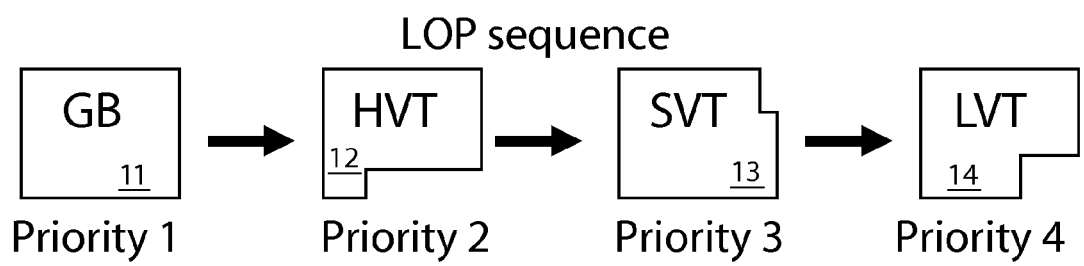
FIG. 2 is a sample sequence of different logic operation cell technologies based on a defined priority in accordance with the embodiments.

FIG. 1 is a representation 10 of an integrated circuit design layout 15 having cells of different technology. The cells can be a plurality of logic operation (LOP) or Boolean cells of different cell technologies. The cell technologies include, for example, different logic circuitry or memories such as high voltage threshold (HVT) transistor cells 12, standard voltage threshold (SVT) transistor cells 13, low voltage threshold (LVT) transistor cells 14 or other cell technologies such as "GB" technology. The integrated circuit design layout 15 can form part of a system having a computer readable storage medium or memory for storing the layout 15. The system can further include a processor coupled to the memory or storage medium where the code stored in the memory defines a priority for each different cell technology in the plurality of LOP cells and forms a layout of a plurality of different LOP cells with at least some of the LOP cells of higher priority LOP technologies overlapping LOP cells of lower priority LOP technologies. Each cell can be assigned a different priority based on a user or customer preference or any number of criteria. For example, the criteria can be based on the cell technology performance (in terms of speed or otherwise), or based on a leakage power, or based on sizing of the technology being used or any combination of factors. As shown in a representation 20 of FIG. 2, each of the different cell technologies is assigned a particular priority. In this example, the GB technology 11 is assigned a first or highest priority, the HVT transistor cell technology (12) is assigned a second highest priority, the SVT transistor cell technology (13) is assigned a third highest priority, and the LVT transistor cell techology (14) is assigned a fourth highest priority.

The system 10 can form the layout of the plurality of different LOP cells on a substrate using photolithography. Referring to a representation 30 of FIG. 3, layout 35 illustrates forming another layout consistent with the embodiments where all of the LOP cells of higher priority LOP technologies overlap LOP cells of lower priority LOP technologies. In this example, the technology of cell 31 has the highest priority, the technology of cell 32 has the second highest priority, the technology of cell 33 has the third highest priority, and the technology of cell 34 has the fourth highest priority. Accordingly, cell 31 of priority 1 (P1) overlaps at least one other cell (32 and 34) of lower priority; cell 32 of priority 2 (P2) overlaps at least one other cell (33) of lower priority, and cell 33 of priority 3 (P3) overlaps at least one other cell (34) of lower priority (P4).

Referring to the embodiments illustrated in FIGS. 4-10, other configurations or layouts are shown consistent with having with at least some of the LOP cells of higher priority LOP technologies overlapping LOP cells of lower priority LOP technologies. Note that all cells do not necessarily have to overlap as in the examples of FIGS. 6 and 10. For example, in the representation 60 of FIG. 6, the layout 65 has cell 61 of highest priority 1 overlapping cell 62 of a second highest priority. Separately, cell 63 of third highest priority overlaps cell 64 of the fourth or lowest priority. In representation 100 of FIG. 10, the layout 105 has cell 101 having P1 overlapping cell 103 having P3 and cell 104 having P4 while cell 102 having P2 stands separately.

In other embodiments as in FIGS. 3-5, and 7-10, one cell can overlap more than one cell of lower priority. For example, representation 40 of FIG. 4 includes a layout 45 with cell 41 (of P1) overlapping cell 42 (of P2), cell 43 (of P3), and cell 44 (of P4). In the representation 50 of FIG. 5, the layout 55 has cell 51 (of P1) overlapping cell 53 (of P3) and cell 54 (of P4). Layout 55 also has cell 52 overlapping just one other cell 54 (of P4). The representations 70 and 80 of FIGS. 7 and 8 also have at least one cell that overlaps more than one cell as will be detailed further below. In FIG. 9, representation 90 includes a layout 95 with cell 91 (of P1) overlapping cell 92

(of P2) and cell 94 (of P4). Cell 92 just overlaps one cell 94 (of P4) and cell 93 (of P3) just overlaps the cell 94. In FIG. 10, the representation 100 includes a layout 105 with cell 101 (of P1) overlapping cell 103 (of P3) and cell 104 (of P4). Cell 102 (of P2) is separated from the other cells and does not overlap other cells.

The representations 70 and 80 of FIGS. 7 and 8 are a further subset of the class of layouts described above since they have multiple cells overlapping more than one cell. For example, in FIG. 7, the layout 75 includes cell 71 (of P1) overlapping cells 73 and 74 and cell 72 (of P2) also overlapping cells 73 and 74. In FIG. 8, the layout 85 includes cell 81 (of P1) overlapping cells 82 (of P2), 83 (of P3), and 84 (of P4). Cell 82 also overlaps cell 83 and 84.

The layouts in FIGS. 1 and 3-10 can also follow other rules or constraints. For example, any cells that do overlap have a higher priority LOP technology that overlaps LOP cells of lower priority. (See FIGS. 6 and 10). Another rule consistent with the embodiments can have layouts that avoid the overlap of LOP cells of higher priority LOP technologies by LOP cells of lower priority LOP technologies. As discussed above, the priority assigned to each LOP cell can be based on a number of factors that can be directed by a user or customer of the system. For example, the plurality of different LOP cells can have different polysilicon critical dimension sizing laid out on a substrate that can be used as the factor or as one of the factors in determining priority. The system would then store data representing assignment of the priority for each LOP cell based on the different LOP technologies in a memory. In one embodiment, the system is an electronic design automation (EDA) tool.

Figure 11:
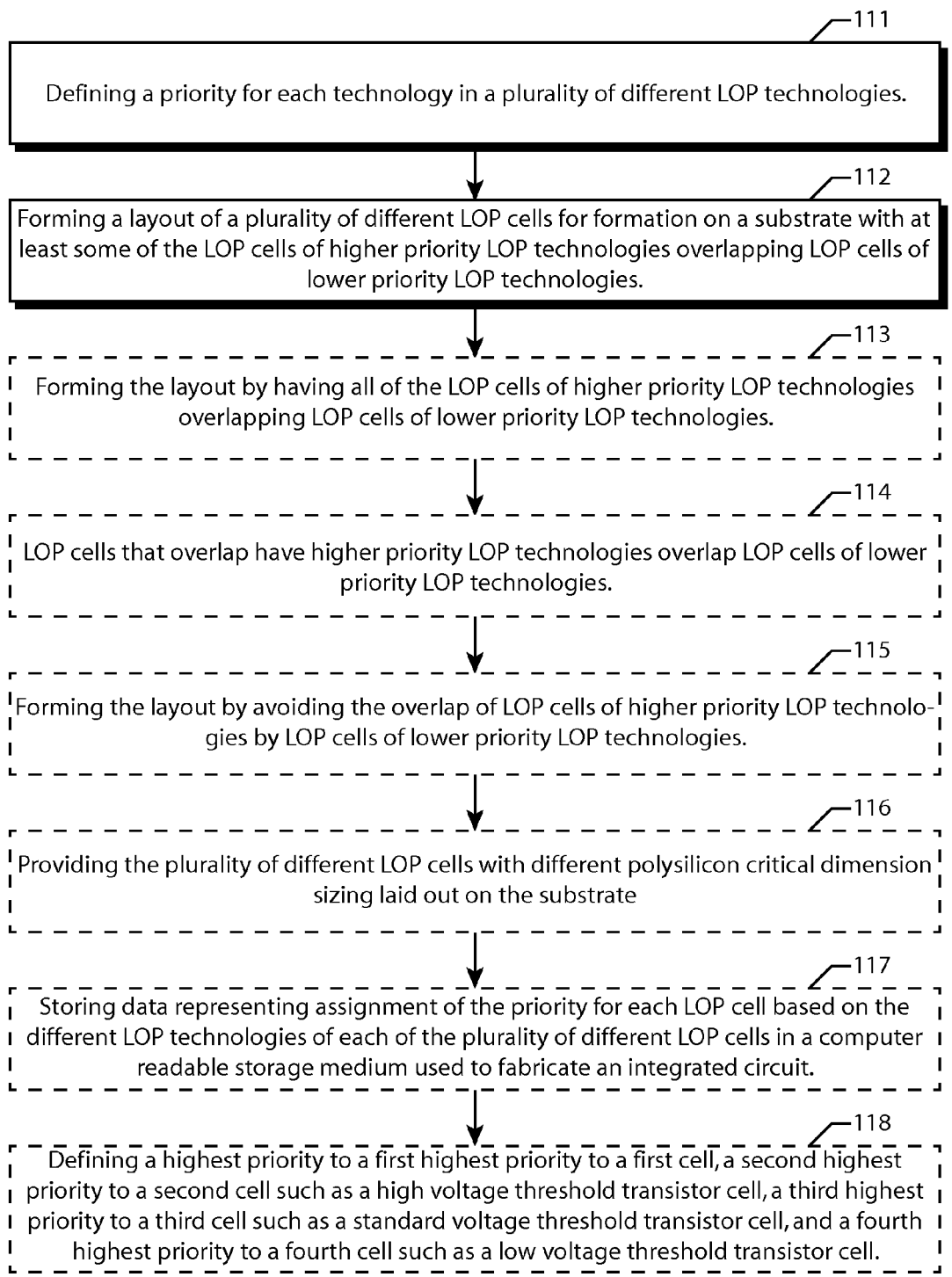
FIG. 11 is a flow chart illustrating a method of in accordance with an embodiment herein.

Referring to FIG. 11, a flow chart illustrates a method 110 of designing a layout for a plurality of different logic operation (LOP) cell technologies that includes defining at 111 a priority for each LOP cell technology in the plurality of different LOP technologies and forming a layout at 112 of a plurality of different LOP cells for formation on a substrate with at least some of the LOP cells of higher priority LOP technologies overlapping LOP cells of lower priority LOP technologies. A system performing this method can be an electronic design automation (EDA) tool. At 113, the layout can optionally have in one embodiment all of the LOP cells of higher priority LOP technologies overlapping LOP cells of lower priority LOP technologies. In another variation at 114, any of the LOP cells that overlap have higher priority LOP technologies overlapping LOP cells of lower priority LOP technologies. In yet another variation at 115, the layout includes avoiding the overlap of LOP cells of higher priority LOP technologies by LOP cells of lower priority LOP technologies. As noted in 116, the plurality of different LOP cells can have different polysilicon critical dimension sizing laid out on a substrate which can serve as a factor for setting priorities to the different cells. At 117, the method 110 can include storing data representing assignment of the priority for each LOP cell based on the different LOP technologies of each of the plurality of different LOP cells in a non-transitory, computer readable storage medium that is accessible for use in a process to fabricate an integrated circuit. In one particular embodiment, the method or system at 118 defines a highest priority to a first cell, a second highest priority to a second cell such as a high voltage threshold transistor cell, a third highest priority to a third cell such as a standard voltage threshold transistor cell, and a fourth highest priority to fourth cell such as a low voltage threshold transistor cell.

Figure 12:
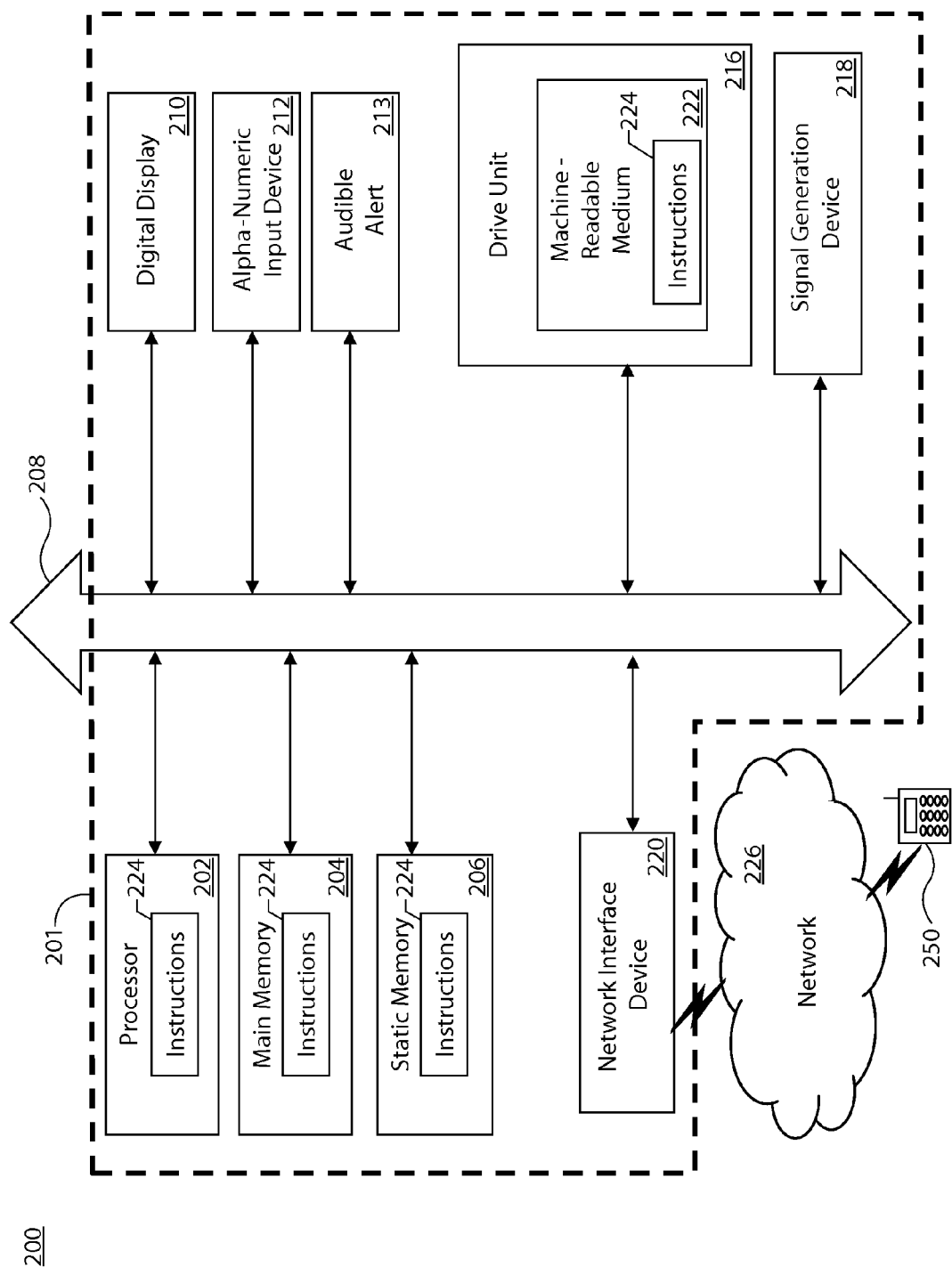
FIG. 12 is a diagrammatic representation of a machine that can perform the method of FIG. 11 in accordance with an embodiment herein.

FIG. 12 depicts an exemplary diagrammatic representation of a machine in the form of a computer system 200 within which a set of instructions, when executed, may cause the machine to perform any one or more of the methodologies discussed above. In some or most embodiments herein, the machine operates as a standalone device. In some embodiments, the machine may be connected (e.g., using a network) to other machines In a networked deployment, the machine may operate in the capacity of a server or a client user machine in server-client user network environment, or as a peer machine in a peer-to-peer (or distributed) network environment. For example, the computer system can include a recipient device 201 and a sending device 250 or vice-versa. For example, the device 201 can be a tool having the EDA tool and the device 250 can be a remote computing device such as a laptop computer, smart phone, or other computer processing device which can receive and/or send signals from and/or to the device 201.

The machine may comprise a server computer, a client user computer, a personal computer (PC), a tablet PC, personal digital assistant, a cellular phone, a laptop computer, a desktop computer, a control system, a network router, switch or bridge, or any machine capable of executing a set of instructions (sequential or otherwise) that specify actions to be taken by that machine It will be understood that a device of the present disclosure includes broadly any electronic device that provides voice, video or data communication and further performs one or more of the functions described or illustrated with respect to FIGS. 1-11. Further, while a single machine is illustrated, the term "machine" shall also be taken to include any collection of machines that individually or jointly execute a set (or multiple sets) of instructions to perform any one or more of the methodologies discussed herein.

The computer system 200 and more particularly the recipient device 201 can include a controller or processor 202 (e.g., a central processing unit (CPU), a graphics processing unit (GPU, or both), a main memory 204 and a static memory 206 such as DRAM, which communicate with each other via a bus 208. The computer system 200 may further include a presentation device such as a video display unit 210 (e.g., a liquid crystal display (LCD), a flat panel, a solid state display, or a cathode ray tube (CRT)). The computer system 200 may include an input device 212 (e.g., a keyboard), a cursor control device (e.g., a mouse, not shown), an audible alert device 213, a disk drive unit 216, a signal generation device 218 (e.g., a speaker or remote control that can also serve as a presentation device) and a network interface device 220. Of course, in the embodiments disclosed, many of these items are optional.

The disk drive unit 216 may include a machine-readable medium 222 on which is stored one or more sets of instructions (e.g., software 224) embodying any one or more of the methodologies or functions described herein, including those methods illustrated above. The instructions 224 may also reside, completely or at least partially, within the main memory 204, the static memory 206, and/or within the processor 202 during execution thereof by the computer system 200. The main memory 204 and the processor 202 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but are not limited to, distributed processing or component/object distributed processing, parallel processing, or virtual machine processing can also be constructed to implement the methods described herein. Further note, implementations can also include neural network implementations, and ad hoc or mesh network implementations between communication devices.

The present disclosure contemplates a machine readable medium containing instructions 224, or that which receives and executes instructions 224 from a propagated signal so that a device connected to a network environment 226 can send or receive voice, video or data, and to communicate over the network 226 using the instructions 224. The instructions 224 may further be transmitted or received over a network 226 via the network interface device 220.

While the machine-readable medium 222 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure. The terms "program," "software application," and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system. Further note that the term "integrated" or "integrated with" such as an inclinometer "integrated with" a shaft or a member can mean in some embodiments that the inclinometer is embedded within the member or shaft and in other embodiments can mean that the inclinometer is affixed to the shaft or member.

It is to be understood that the present invention can also be embodied as computer-readable codes on a computer-readable recording medium. The computer-readable recording medium is any data storage device that can store data which can thereafter be read by a computer system. Examples of the computer-readable recording medium include, but are not limited to, read-only memory (ROM), random-access memory(RAM), CD-ROMs, magnetic tapes, floppy disks, optical data storage devices, and carrier waves (such as data transmission through the Internet via wired or wireless transmission paths). The computer-readable recording medium can also be distributed over network-coupled computer systems so that the computer-readable code is stored and executed in a distributed fashion. Also, functional programs, codes, and code segments for accomplishing the present invention can be easily construed as within the scope of the invention by programmers skilled in the art to which the present invention pertains.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized Accordingly, the specification and drawings are to be regarded in an illustrative rather than a restrictive sense.

In one embodiment, a method of designing a layout for a plurality of different logic operation (LOP) cell technologies includes defining a priority for each LOP cell technology in the plurality of different LOP technologies and forming a layout the plurality of different LOP cells for formation on a substrate with at least some of the LOP cells of higher priority LOP technologies overlapping LOP cells of lower priority LOP technologies.

In another embodiment, a system can include an integrated circuit layout stored in a computer readable storage medium or memory for storing the layout. The system can further include a processor coupled to the memory or storage medium where the code stored in the memory defines a priority for each different cell technology in the plurality of LOP cells and (when the code is executed) forms a layout of a plurality of different LOP cells with at least some of the LOP cells of higher priority LOP technologies overlapping LOP cells of lower priority LOP technologies.

In yet another embodiment, a non-transitory computer readable storage medium encoded with computer programming instructions which when executed by a computer performs operations including defining a priority for each different cell technology in the plurality of LOP cells and forming a layout of a plurality of different LOP cells with at least some of the LOP cells of higher priority LOP technologies overlapping LOP cells of lower priority LOP technologies.

Again, the preceding merely illustrates the principles of the disclosure. It will thus be appreciated that those skilled in the art will be able to devise various arrangements which, although not explicitly described or shown herein, embody the principles of the disclosure and are included within its spirit and scope. Embodiments can include, but are not limited to the design method of rounding corners in a light guiding grid, but can include other techniques within the parameters described herein that can reduce or block optical crosstalk as noted.

Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "to", "from", "lower," "upper," "horizontal,"

"vertical," "above," "below," "up," "down," "before", "after", "top" and "bottom" as well as derivatives thereof (e.g., "horizontally,", "vertically", "downwardly," "upwardly," etc.) should be construed to refer to the orientation as then described or as shown in the drawing under discussion. The drawings are arbitrarily oriented for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments, which can be made by those skilled in the art without departing from the scope and range of equivalents.

We claim:

1. A method of designing a layout for a plurality of different logic operation (LOP) cell technologies, comprising:
    defining, by a system, a priority for each logic operation (LOP) cell technology in the plurality of different LOP technologies; and
    the system creating a layout of a semiconductor device on a substrate based on the priorities, the layout including a plurality of different LOP cells for formation on said substrate with at least some of the LOP cells of higher priority LOP technologies overlapping LOP cells of lower priority LOP technologies,
    wherein the creating a layout comprises creating a layout in a non-transitory computer readable storage medium and the priority is based on critical dimension sizing laid out on the substrate.

2. The method of claim 1, wherein the step of the system creating a layout has all of the LOP cells of higher priority LOP technologies overlapping LOP cells of lower priority LOP technologies.

3. The method of claim 1, wherein any of the LOP cells that overlap have higher priority LOP technologies overlapping LOP cells of lower priority LOP technologies.

4. The method of claim 1, wherein the step of the system creating the layout includes avoiding the overlap of LOP cells of higher priority LOP technologies by LOP cells of lower priority LOP technologies.

5. The method of claim 1, wherein the critical dimension sizing comprises polysilicon critical dimension sizing.

6. The method of claim 1, further comprising storing data representing assignment of the priority for each said LOP cell based on the different LOP technologies of each of the plurality of different LOP cells, in said non-transitory, computer readable storage medium that is accessible for use in a process to fabricate said semiconductor device on a substrate, said semiconductor device being an integrated circuit.

7. The method of claim 1, wherein the system is an electronic design automation (EDA) tool.

8. A system, comprising:
    a non-transitory computer readable storage medium for storing data representing a layout of an integrated circuit (IC) comprising a plurality of logic operation (LOP) cells of different cell technologies and for storing computer code; and
    a processor coupled to the non-transitory computer readable storage medium, the processor executing the computer code to perform operations comprising:
    defining a priority for each different cell technology in the plurality of LOP cells; and
    forming a layout of a semiconductor device on a substrate based on the priorities, the layout including a plurality of different LOP cells with at least some of the LOP cells of higher priority LOP technologies overlapping LOP cells of lower priority LOP technologies,
    wherein the priority is based on critical dimension sizing laid out on the substrate.

9. The system of claim 8, further comprising the system forming the layout of the plurality of different LOP cells on said substrate using photolithography.

10. The system of claim 8, wherein the step of forming the layout includes all of the LOP cells of higher priority LOP technologies overlapping LOP cells of lower priority LOP technologies.

11. The system of claim 8, wherein any of the LOP cells that overlap have higher priority LOP technologies overlapping LOP cells of lower priority LOP technologies.

12. The system of claim 8, wherein the step of forming the layout includes avoiding the overlap of LOP cells of higher priority LOP technologies by LOP cells of lower priority LOP technologies.

13. The system of claim 8, wherein the critical dimension sizing comprises polysilicon critical dimension sizing.

14. The system of claim 8, further comprising storing data representing assignment of the priority for each LOP cell based on the different LOP technologies of each of the plurality of different LOP cells, in the non-transitory computer readable storage medium.

15. The system of claim 8, wherein the system is an electronic design automation (EDA) tool.

16. A non-transitory computer readable storage medium encoded with computer programming instructions, such that when the computer programming instructions are executed by a computer, the computer performs operations comprising:
    defining a priority for each different cell technology in a plurality of logic operation (LOP) cells; and
    forming a layout of a semiconductor device on a substrate based on the priorities, the layout including the plurality of different LOP cells, with at least some of the LOP cells of higher priority LOP technologies overlapping LOP cells of lower priority LOP technologies,
    wherein the priority is based on polysilicon critical dimension sizing laid out on the substrate.

17. The non-transitory computer readable storage medium of claim 16, wherein the computer programming instructions, when executed, cause the computer to perform operations comprising forming the layout by avoiding the overlap of LOP cells of higher priority LOP technologies by LOP cells of lower priority LOP technologies.

18. The non-transitory computer readable storage medium of claim 16, wherein the step of forming a layout comprises all of the LOP cells of higher priority LOP technologies overlapping LOP cells of lower priority LOP technologies.

* * * * *